United States Patent
Bach

(10) Patent No.: US 7,772,126 B2
(45) Date of Patent: Aug. 10, 2010

(54) HARD MASK ARRANGEMENT, CONTACT ARRANGEMENT AND METHODS OF PATTERNING A SUBSTRATE AND MANUFACTURING A CONTACT ARRANGEMENT

(75) Inventor: Lars Bach, Ullersdorf (DE)

(73) Assignee: Qimonda AG, Munich (DE)

( * ) Notice: Subject to any disclaimer, the term of this patent is extended or adjusted under 35 U.S.C. 154(b) by 748 days.

(21) Appl. No.: 11/583,145

(22) Filed: Oct. 19, 2006

(65) Prior Publication Data

US 2008/0093710 A1    Apr. 24, 2008

(51) Int. Cl.
*H01L 21/467* (2006.01)
(52) U.S. Cl. .............. 438/736; 438/738; 257/734; 257/774; 257/E21.027; 257/E21.035
(58) Field of Classification Search .............. 438/736, 438/738, 597; 257/734, 774
See application file for complete search history.

(56) References Cited

U.S. PATENT DOCUMENTS

2005/0112506 A1* 5/2005 Czech et al. ............... 430/322
2006/0094250 A1* 5/2006 Lee et al. .................. 438/758
2006/0258162 A1* 11/2006 Abatchev et al. .......... 438/725
2007/0082448 A1* 4/2007 Kim et al. .................. 438/268
2007/0096188 A1* 5/2007 Maekawa ................... 257/306

* cited by examiner

Primary Examiner—A. Sefer
(74) Attorney, Agent, or Firm—Edell, Shapiro & Finnan, LLC

(57) ABSTRACT

An interlayer is disposed on a pattern surface of a substrate. A buried hard mask may be provided on the interlayer. The buried hard mask includes a template opening having a template length along a line axis and a template width perpendicular thereto. The buried hard mask is filled with a fill material. A top mask is provided above the filled buried hard mask. The top mask includes a trim opening crossing the template opening and having a trim width along the line axis that is smaller than the template length. By etching the fill material and the interlayer using the top and buried hard mask a process section of the pattern surface may be exposed such that a target length and width of the process section result from the template and the trim widths. The planar dimensions of the process section may be decoupled from each other.

5 Claims, 16 Drawing Sheets

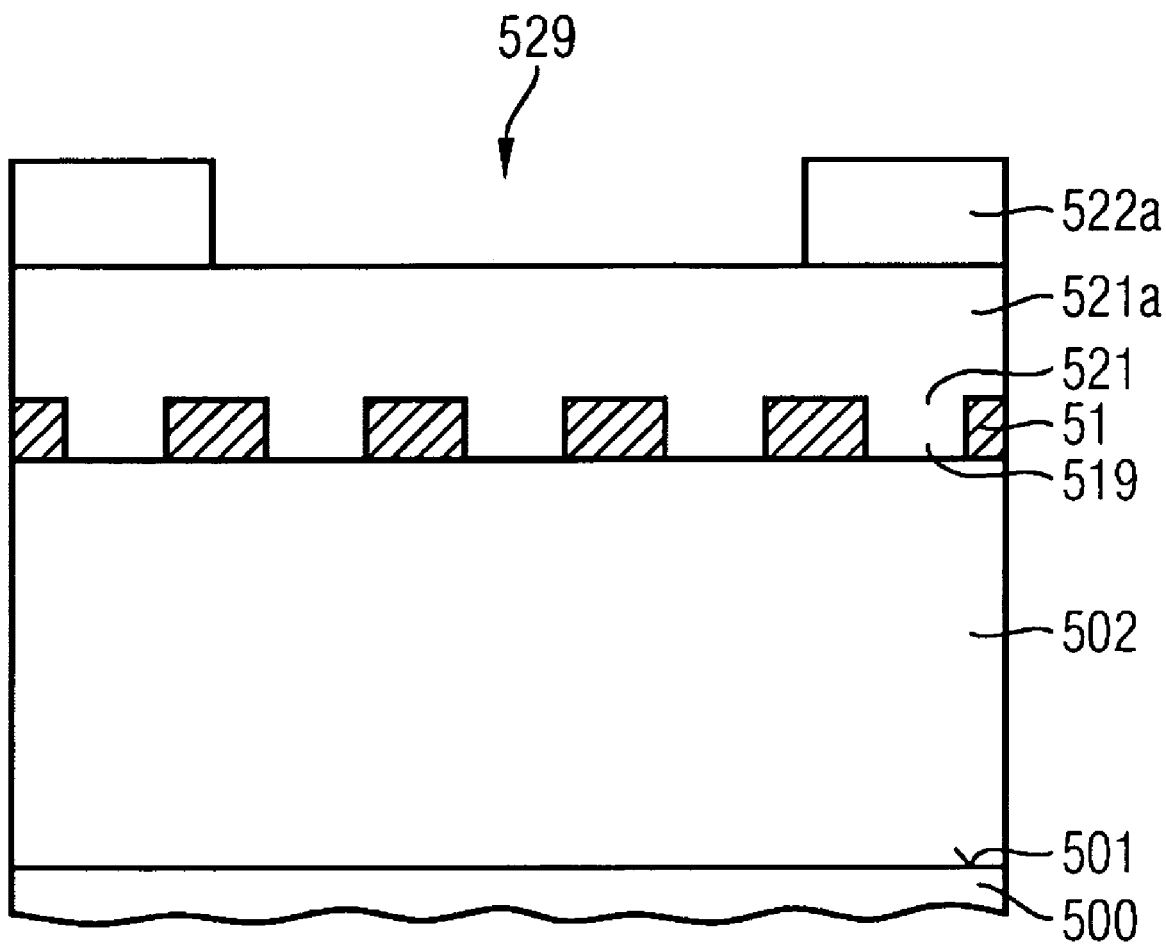

HARD MASK ARRANGEMENT, CONTACT ARRANGEMENT AND METHODS OF PATTERNING A SUBSTRATE AND MANUFACTURING A CONTACT ARRANGEMENT

BACKGROUND

The application of resolution enhancement techniques improves the resolution of optical lithographic systems and makes feasible the arrangement of dense line fields with a plurality of narrow line structures being arranged in parallel at a narrow pitch along a pitch axis that is perpendicular to the line axis. Dense line fields are obligatory for sensor arrays and memory cell arrays, wherein a plurality of identical cells are arranged along lines. The line structures may be gate line structures connecting the gate electrodes of access transistors of memory cells, data lines or supply lines that are connected to memory cells being arranged along a line.

Usually, the gate, supply and data lines of sensor or memory cells are connected to further electrical circuits via connection lines that are provided in a connection plane above or below the line field. Each array comprises contact structures that connect each single cell, a group of cells, or the cells of one of the lines to a connection line in the connection plane. For these contact structures the resolution enhancement techniques that make feasible the patterning of dense line fields are not applicable to the same degree. For example, the formation of an isolated contact chain with contacts having the same width and being arranged along a pitch axis but lacking of corresponding neighboring structures perpendicular to the pitch axis requires a minimum length of the contacts of about six times the width.

In applications in which the contact structures provide an electrical contact to an impurity region in a semiconductor substrate on which surface gate line structures are arranged, the length of the contact structures may be adjusted by sidewall spacer structures encapsulating the gate line structures. In the course of a transition to even narrower structures having a line width of less than 50 nanometers, the sidewall spacer structures and cap structures that encapsulate the gate lines may not have a sufficient thickness to protect the gate lines against a misaligned etch of the contact holes. Insufficient electrical decoupling or electrical short circuits between the contacts and the gate lines may occur. Further, the required minimum length of the contacts in the connection plane requires a wider distance of neighboring structures such that more substrate area is consumed.

Various techniques for the formation of two-dimensional structures with sublithographic feature size along both planar axes are yet described that require a plurality of additional critical process steps and additional equipment. At the same time, new photo resists developed for further shrinking feature sizes show lower etch selectivity against usual hard mask materials.

Therefore a need exists for a simple and stable method of patterning a substrate that makes feasible the formation of structures with sublithographic planar dimensions in/of layers having a thickness exceeding the planar dimensions.

SUMMARY

Methods are described herein for patterning a substrate via a hard mask arrangement and for manufacturing a contact arrangement. Also described herein is a hard mask arrangement for patterning a substrate or for manufacturing a contact arrangement. In addition, a contact arrangement and an interconnect structure, resulting from the described methods, are described.

More particularly, an interlayer is disposed on a pattern surface of a substrate. A buried hard mask may be provided on the interlayer. The buried hard mask includes a template opening having a template length along a line axis and a template width perpendicular thereto. The buried hard mask is filled with a fill material. A top mask is provided above the filled buried hard mask. The top mask includes a trim opening crossing the template opening and having a trim width along the line axis that is smaller than the template length. By etching the fill material and the interlayer using the top and buried hard mask a process section of the pattern surface may be exposed such that a target length and width of the process section result from the template and the trim widths. The planar dimensions of the process section may be decoupled from each other.

The above and still further features and advantages of the described methods and devices will become apparent upon consideration of the following definitions, descriptions and descriptive figures of specific embodiments thereof, wherein like reference numerals in the various figures are utilized to designate like components. While these descriptions go into specific details of the methods and devices, it should be understood that variations may and do exist and would be apparent to those skilled in the art based on the descriptions herein.

BRIEF DESCRIPTION OF THE DRAWINGS

The methods and devices are explained in more detail below with reference to exemplary embodiments, where:

FIGS. 11A-11C show a plan view and two cross-sectional views of a section of a hard mask arrangement according to another exemplary embodiment of the device.

DETAILED DESCRIPTION

Figure 1A:
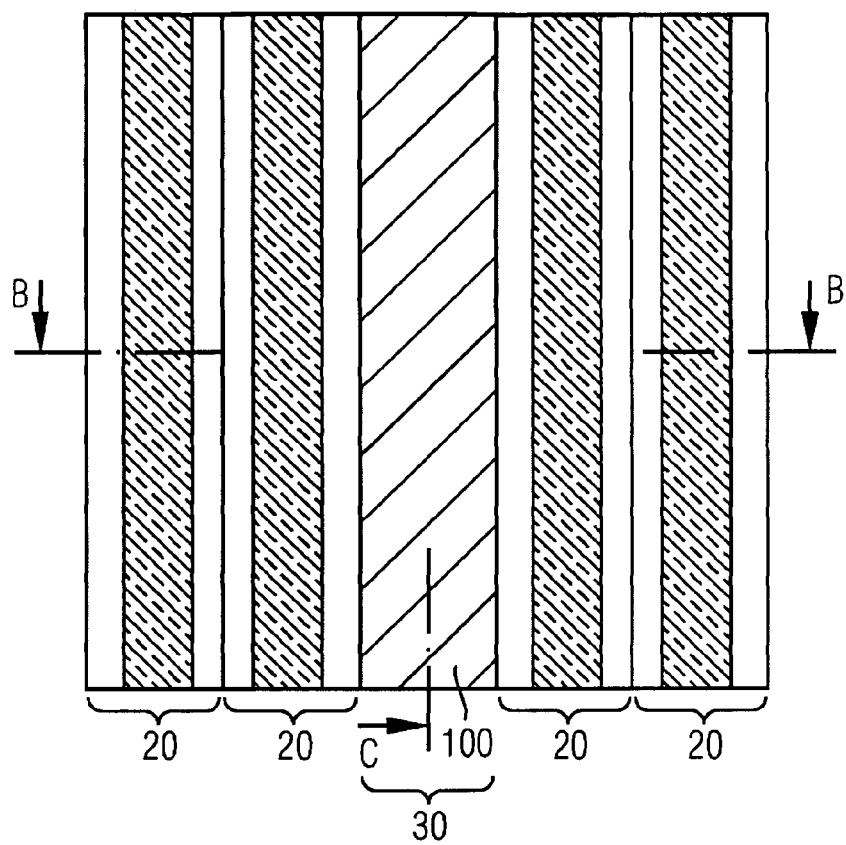
FIGS. 1A-1C show a plan view and two cross-sectional views of a section of a substrate for illustrating a method of patterning the substrate according to an exemplary embodiment of the device.

A method is provided for patterning a substrate including a pattern surface. An interlayer is disposed on the pattern surface. A buried mask is provided on the interlayer, wherein the buried mask includes a template opening that has a template length along a line axis and a template width perpendicular to the line axis. The buried mask is filled with a fill material. A top mask of amorphous carbon is provided above the filled buried mask, wherein the top mask includes a trim opening that crosses the template opening and that has a trim width along the line axis. The trim width is smaller than the template length. The fill material and the interlayer are etched using the top and the buried mask. A process section of the pattern surface is exposed. A target length and a target width of the process section result in each case from the template width and the trim width.

In addition, another method is provided for forming a contact arrangement. A substrate with a pattern surface is provided, wherein the substrate comprises contact areas that adjoin the pattern surface. An interlayer is disposed above the pattern surface. A buried mask is provided on the interlayer. The buried mask includes a row of template openings having in each case a template length along a line axis and a template width along a pitch axis that runs perpendicular to the line axis. The template openings are arranged along the pitch axis and are filled with a fill material. A top mask of amorphous carbon is provided above the filled buried mask, wherein the top mask includes a trim opening crossing the template openings and having a trim width along the line axis that is smaller then the template length. The fill material and the interlayer are etched using the top and the buried mask to expose the contact areas of the pattern surface.

Furthermore, a hard mask arrangement is provided which comprises a substrate with a pattern surface and an interlayer that covers the pattern surface and has a plane surface facing the pattern surface. A buried mask is arranged on the interlayer and comprises template openings that have in each case a template length along a line axis and a template width along a pitch axis perpendicular to the line axis. The template openings are arranged along the pitch axis in each case in a distance to each other corresponding to the template width and are filled with a fill material. A top mask of amorphous carbon is arranged above the buried mask. The top mask has a trim opening having a trim width along the line axis that is smaller than the template length.

In addition, an interconnection structure is provided which comprises a substrate with a pattern surface that comprises a contact area. An interlayer is disposed on the pattern surface. A buried mask covers the interlayer and has an upper edge and a template opening, wherein the template opening has a template length along a line axis. A fill material fills the template opening partly. Further, the interconnection structure comprises a contact structure, extending from the upper edge of the buried mask to the contact area through a portion of the template opening. A connection line bears on the contact structure and on sections of the buried hard mask, extends perpendicular to the line axis and has a line width along the line axis that is smaller than the template length.

Likewise, a contact arrangement is provided which comprises a substrate including a pattern surface and a plurality of contact areas adjoining the pattern surface. The contact areas are arranged along a contact row that extends along a pitch axis. The contact arrangement comprises further two gate lines that are arranged on the pattern surface and that extend along the pitch axis on both sides of the contact row. An interlayer separates the two gate lines. A buried mask covers the interlayer and includes an upper edge and template openings, wherein the template openings have in each case a template width along the pitch axis and a template length along the line axis that is perpendicular to the pitch axis. The template openings are further arranged along the pitch axis in each case in a distance to each other that corresponds to the template width. A fill material fills the template openings partly. Further, the contact arrangement comprises a plurality of contact structures, wherein each contact structure extends from the upper etch of the buried mask to one of the contact areas and passes through a portion of one of the template openings.

Exemplary embodiments will now be described in connection with the figures. In the following, the figures designated by "A" refer in each case to a plan view of a section of the respective substrate. The figures designated by "B" and "C" illustrate the cross-sections along the lines B-B and C-C as depicted in the figures designated by "A". The cross-section B-B runs along a line axis and the cross-section C-C along a pitch axis which is perpendicular to the line axis. Though FIGS. 1A-1C to 7A-7C are described in context with a method of patterning a substrate, they may also be part of a method of manufacturing an interconnection structure or a contact arrangement as further illustrated in FIGS. 8A-8C and FIGS. 9A-9C.

Figure 1B:
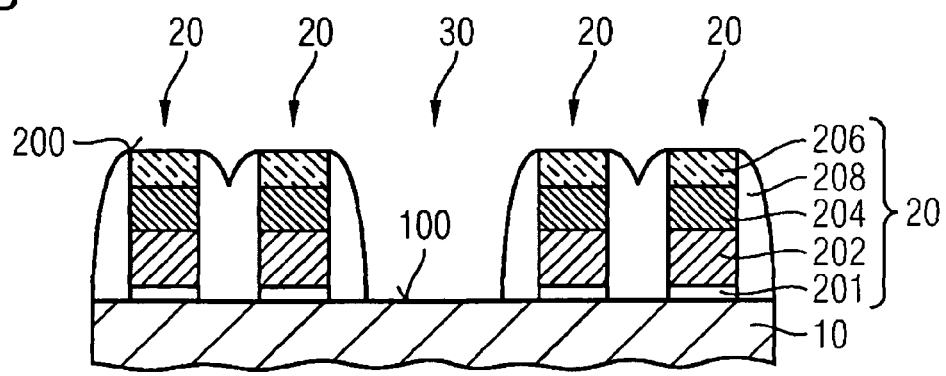
Figure 1C:

Referring to FIGS. 1B and 1C, a substrate is provided. In this exemplary embodiment, the substrate comprises a semiconductor substrate 10 including a substrate surface 100. The term "semiconductor substrate" as used in the following, is understood to include semiconductor wafers. The term "semiconductor substrate" is also used to refer to semiconductor structures during processing and may include other layers that have previously been fabricated. The semiconductor substrate may comprise doped and undoped sections, epitaxial semiconductor layers supported by a base semiconductor or a base insulator as well as other semiconductor and insulator structures.

The substrate comprises further gate lines 20 that are arranged on the substrate surface 100. The gate lines 20 run in pairs along the pitch axis, wherein a space 30 separates a pair of narrow spaced gate lines 20 from the neighboring pair of narrow spaced gate lines 20. The space 30 may expose contact areas of the substrate surface 100. In the contact areas impurity regions 101, shown in FIGS. 10B and 10C, which are formed in the semiconductor substrate 10 may adjoin the substrate surface 100.

Each gate line 20 comprises a gate dielectric 201 being arranged on the substrate surface 100. The gate dielectric 201 is for example a silicon oxide and may have a thickness of less than 8 nanometers. A gate conductor layer 202 covers the gate dielectric 201. The gate conductor layer 202 may be made from heavily doped polycrystalline silicon. A high conductivity layer 204 may be disposed on the gate conductor layer 202. The high conductivity layer 204 may comprise a layer of a metal or a conductive metal compound. A dielectric cap layer 206 is disposed on the high conductivity layer 204. The cap layer 206 is for example a silicon nitride layer. The gate lines 20 may further comprise barrier and adhesive layers (not illustrated). Sidewall spacers 208 elongate along the vertical sidewalls of the layer stacks 201, 202, 204, and 206 and may be made from a silicon oxide or a silicon nitride.

The width of the gate lines 20 may be 20 to 60 nanometers and the height of the gate lines 20 may range from 150 to 350 nanometers. The semiconductor substrate 10 and the gate lines 20 form a substrate having a pattern surface 200 which is formed in sections by the exposed sections of the substrate surface 100 and the exposed surfaces of the gate lines 20.

Figure 2A:
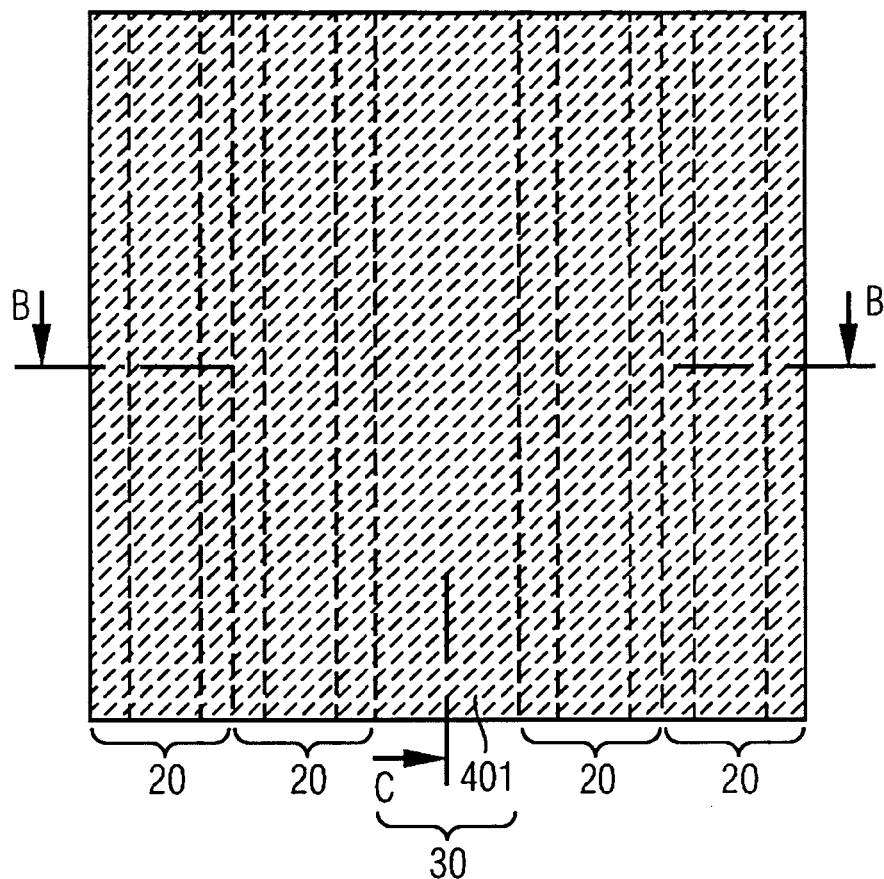
FIGS. 2A-2C show a plan view and two cross-sectional views of the section of a substrate for illustrating the patterning method according to the exemplary embodiment of FIGS. 1A-1C after providing an etch stop liner.
Figure 2B:
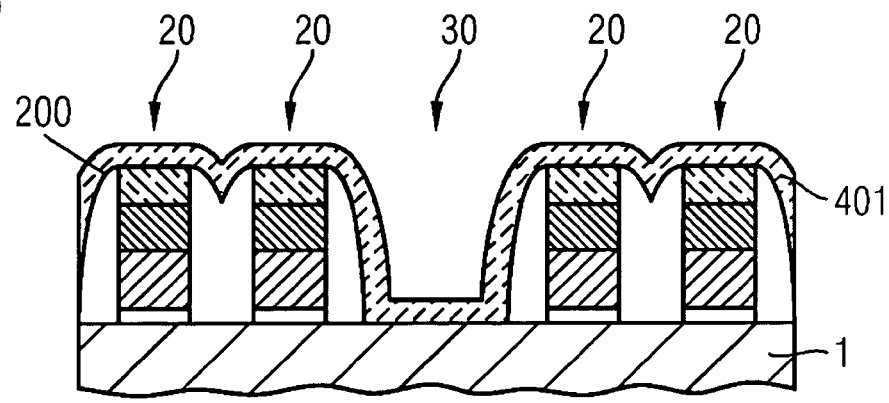
Figure 2C:
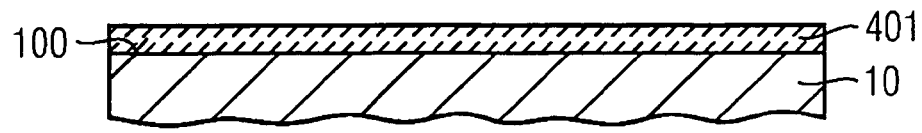

With regard to FIGS. 2A-2C, an etch stop liner 401 may be deposited. The etch stop layer 401 may be a silicon oxinitride layer that covers the pattern surface 200 in a conformal layer thickness of about 5 to 30 nanometer.

Figure 3A:
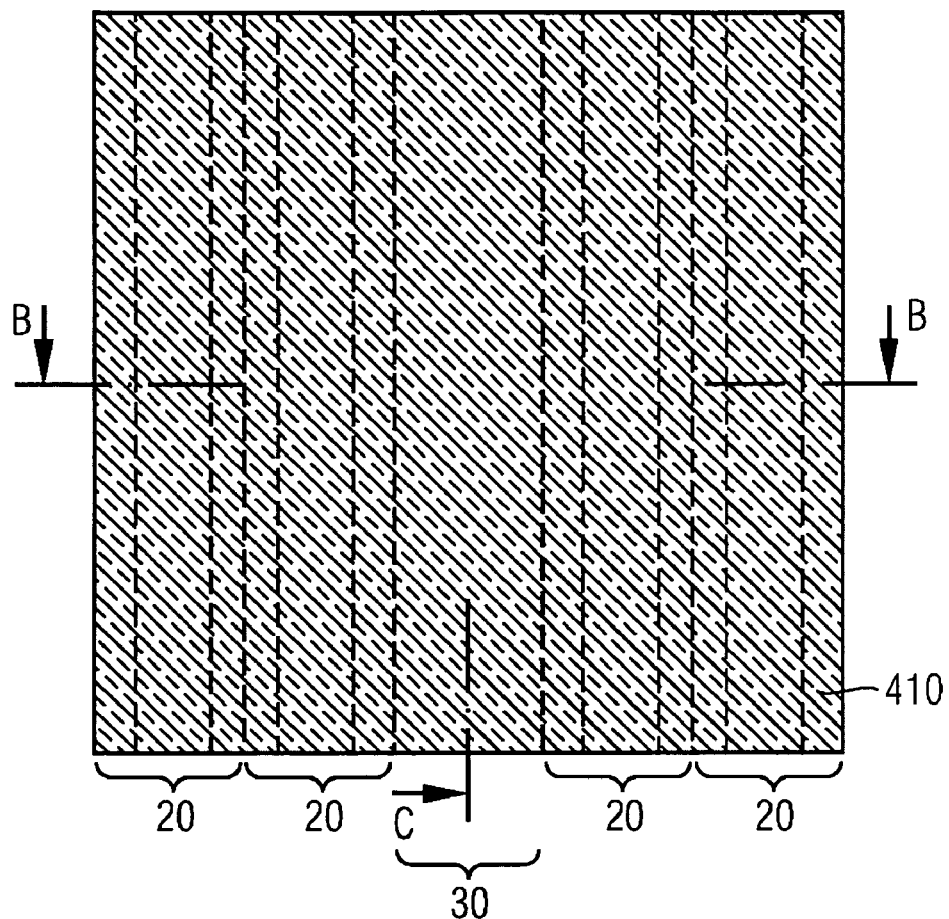
FIGS. 3A-3C show a plan view and two cross-sectional views of the section of a substrate for illustrating the patterning method according to the exemplary embodiment of FIGS. 1A-1C after providing a buried mask layer.
Figure 3B:
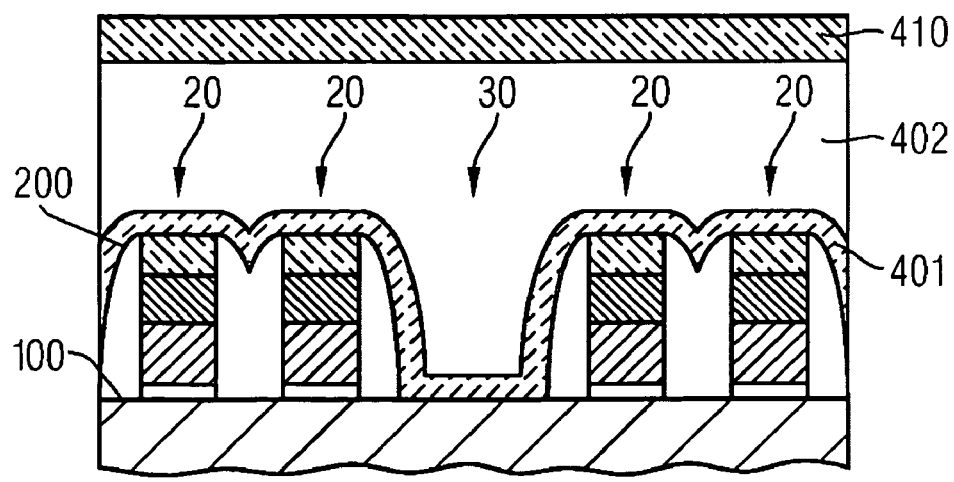
Figure 3C:
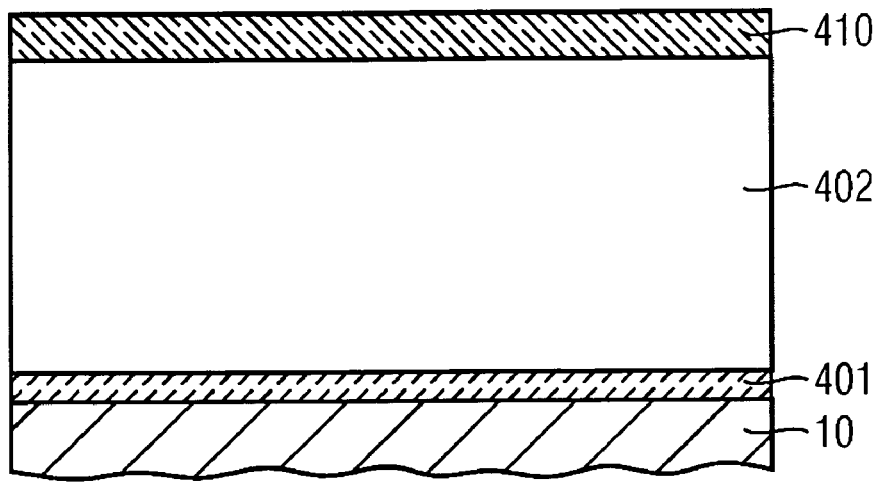

According to FIGS. 3A-3C, an interlayer 402 is provided above the pattern surface 200. The interlayer 402 may be formed by depositing boron phosphorus doped silicon glass (BPSG) and then planarizing the deposited BPSG, for example by a chemical mechanical polishing step. Then, a buried mask layer 410 may be deposited on the planarized interlayer 402.

As illustrated in FIG. 3B, the interlayer 402 fills the spaces 30 and covers the etch stop liner 401. The interlayer 402 may overfill the gate lines 20 in a thickness of 50 to 100 nanometers. The thickness of the interlayer 402 above the substrate surface 100 may be more than 300 nanometers. The buried mask layer 410 may be a silicon nitride layer having a thickness of about 30 to 80 nanometer. According to another embodiment, the buried mask layer 410 is a silicon carbide layer.

Figure 4A:
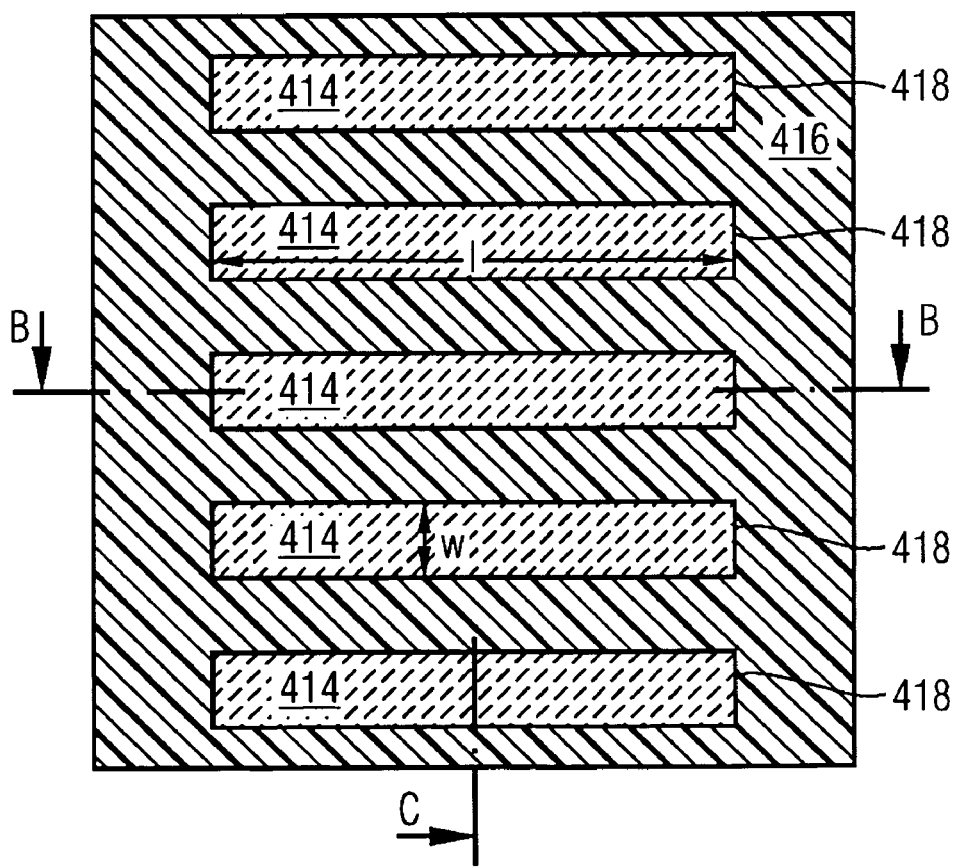
FIGS. 4A-4C show a plan view and two cross-sectional views of the section of a substrate for illustrating the patterning method according to the exemplary embodiment of FIGS. 1A-1C after patterning a first resist mask.
Figure 4B:
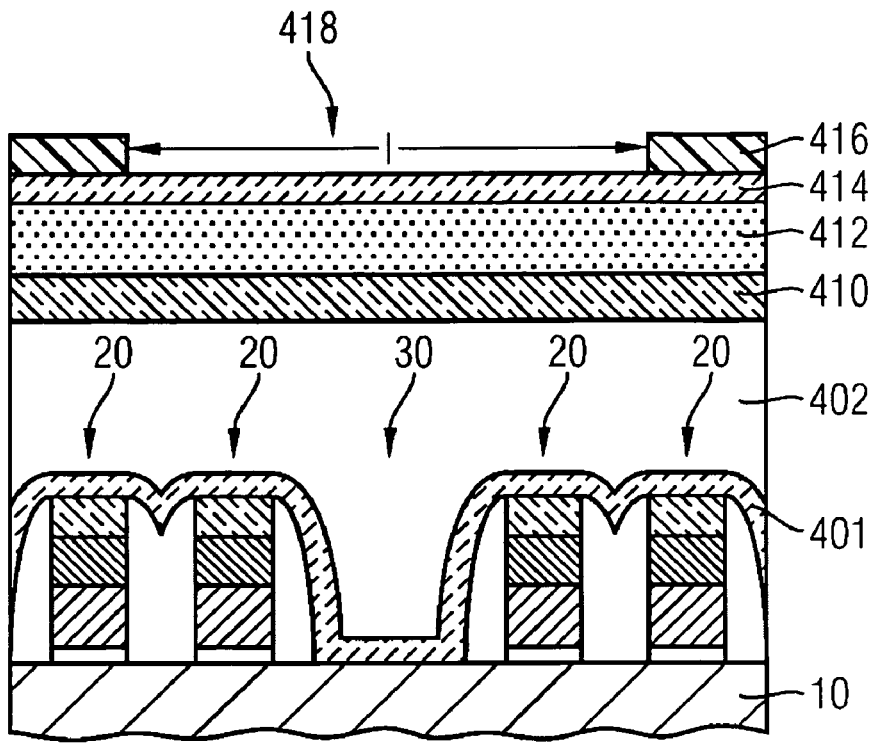
Figure 4C:
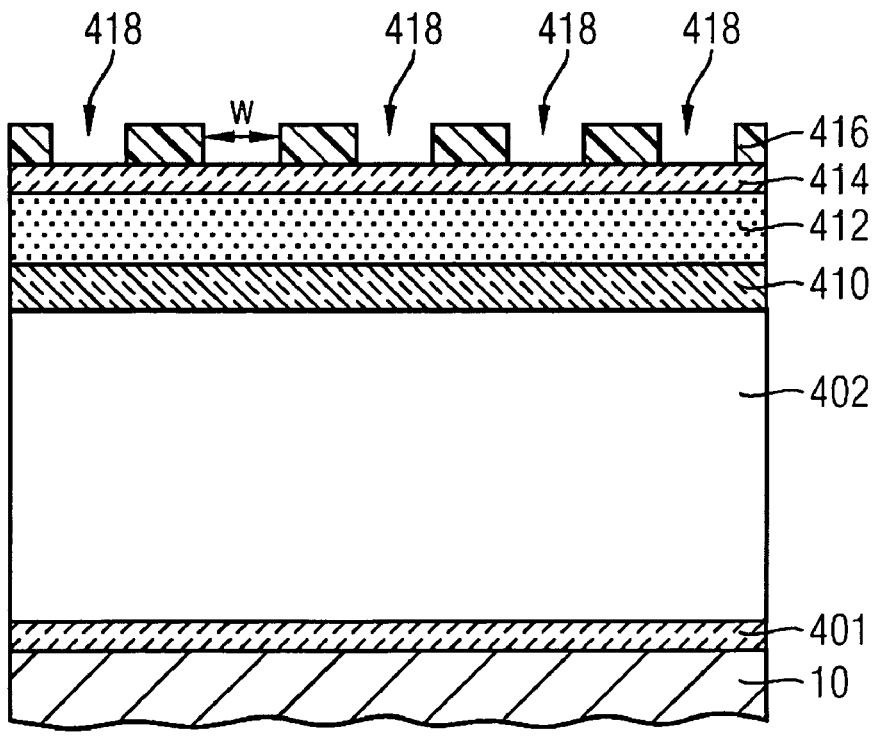

FIGS. 4A-4C relate to an exemplary process for patterning the buried mask layer 410. As illustrated in FIG. 4B, a first sacrificial mask layer 412 may be deposited on the buried mask layer 410. Then a second sacrificial mask layer 414 may be deposited on the first sacrificial mask layer 412. A first resist mask 416 may be provided on the second sacrificial mask layer 414 by, for example, photolithographic techniques.

As further depicted in FIG. 4A, the first resist mask 416 comprises resist openings 418 with a length I along the line axis and a width w along the pitch axis. The width w of the resist openings 418 may be about 20 to 60 nanometer. The length of the resist openings 418 may be about five to seven times the width w and is determined by lithographic requirements. The resist openings 418 expose sections of the second sacrificial mask layer 414.

According to this exemplary embodiment, the first sacrificial mask layer 412 is an amorphous carbon layer having a thickness of about 20 to 200 nanometer. The amorphous carbon layer is patterned using a silicon oxinitride layer as the second sacrificial mask layer 414, wherein the silicon oxinitride layer may have a thickness of about 10 to 50 nanometer.

Figure 5A:
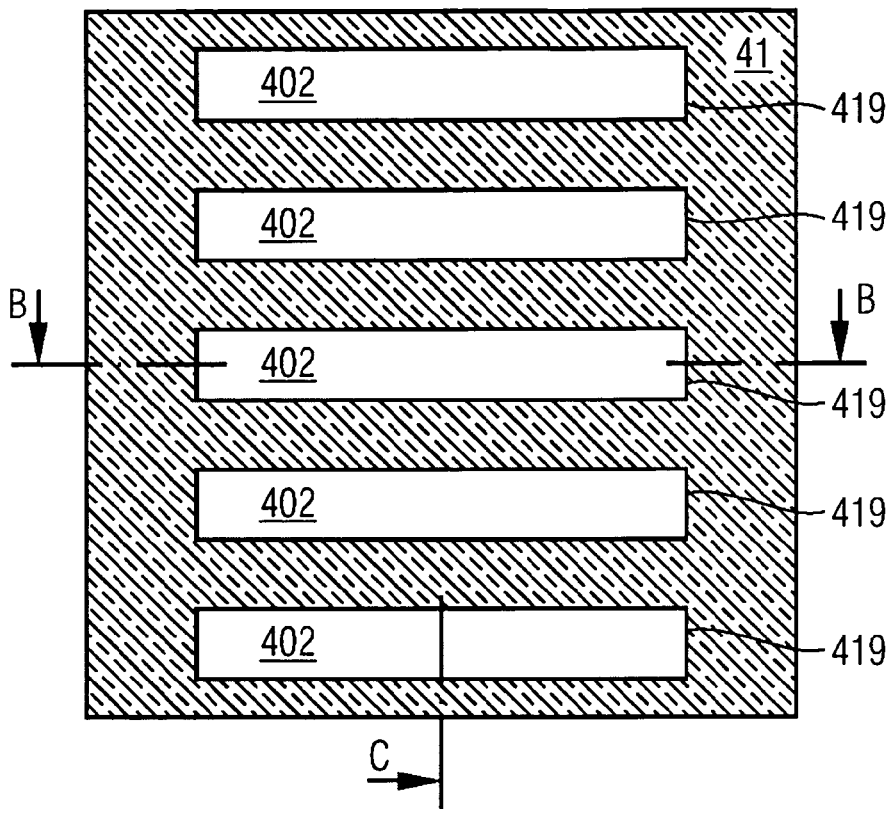
FIGS. 5A-5C show a plan view and two cross-sectional views of the section of a substrate for illustrating the patterning method according to the exemplary embodiment of FIGS. 1A-1C after providing a buried mask.
Figure 5B:
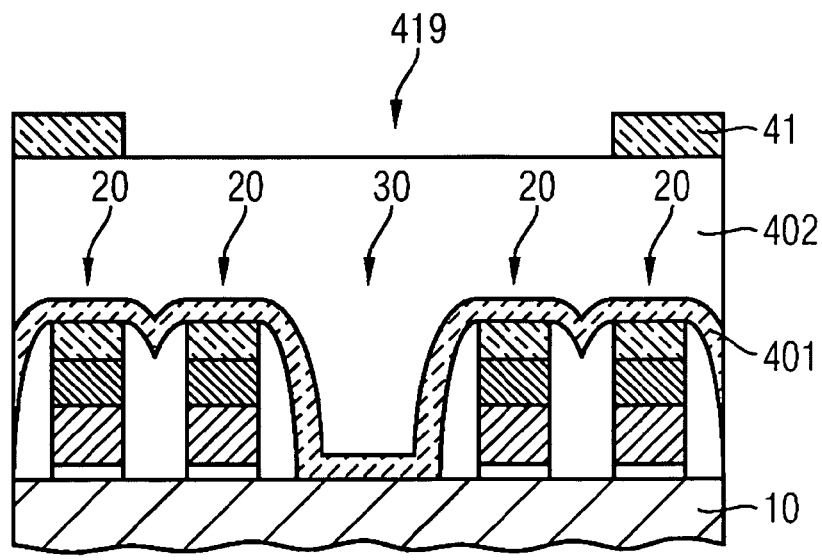
Figure 5C:
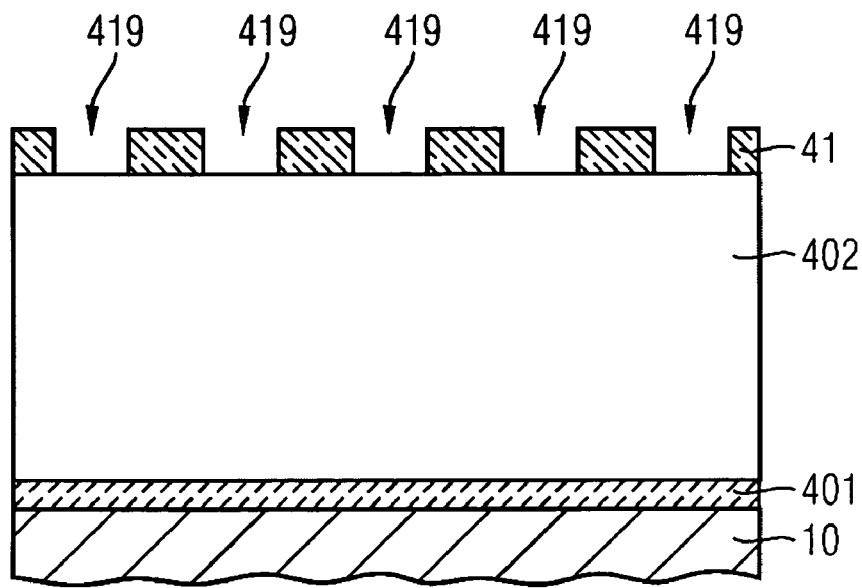

With regard to FIGS. 5A-5C, the second sacrificial mask layer 414 is patterned by removing the sections exposed by the resist openings 418, wherein sections of the first sacrificial mask layer 412 corresponding to the resist openings 418 are exposed. Then, using the patterned sacrificial mask layer 414 as etch mask, the first sacrificial mask layer 412 is patterned, wherein sections of the buried mask layer 410 corresponding to the resist openings 418 are exposed. The exposed sections of the buried mask layer 410 are removed selectively using the patterned first sacrificial mask layer 412 as etch mask to form from the buried mask layer 410 a buried hard mask 41 with template openings 419.

FIG. 5B shows the buried hard mask 41 that results from the buried mask layer 410. The template openings 419 extend along the line axis and expose sections of the smooth planarized surface of the interlayer 402.

The pattern of the buried hard mask 41 is depicted in FIG. 5A and corresponds substantially to the pattern of the first resist mask 416 as depicted in FIGS. 4A-4C. By patterning the buried mask layer 410 using the second sacrificial mask layer 414, the thickness of the buried hard mask 41 may be decoupled from the properties of a resist material used for the first resist mask 416. The process window for patterning the buried mask layer 410 is wider and the process more stable.

According to other embodiments (not shown) the buried hard mask 41 may be formed directly via a first resist mask 416 or via a polysilicon layer as intermediate mask layer.

Figure 6A:
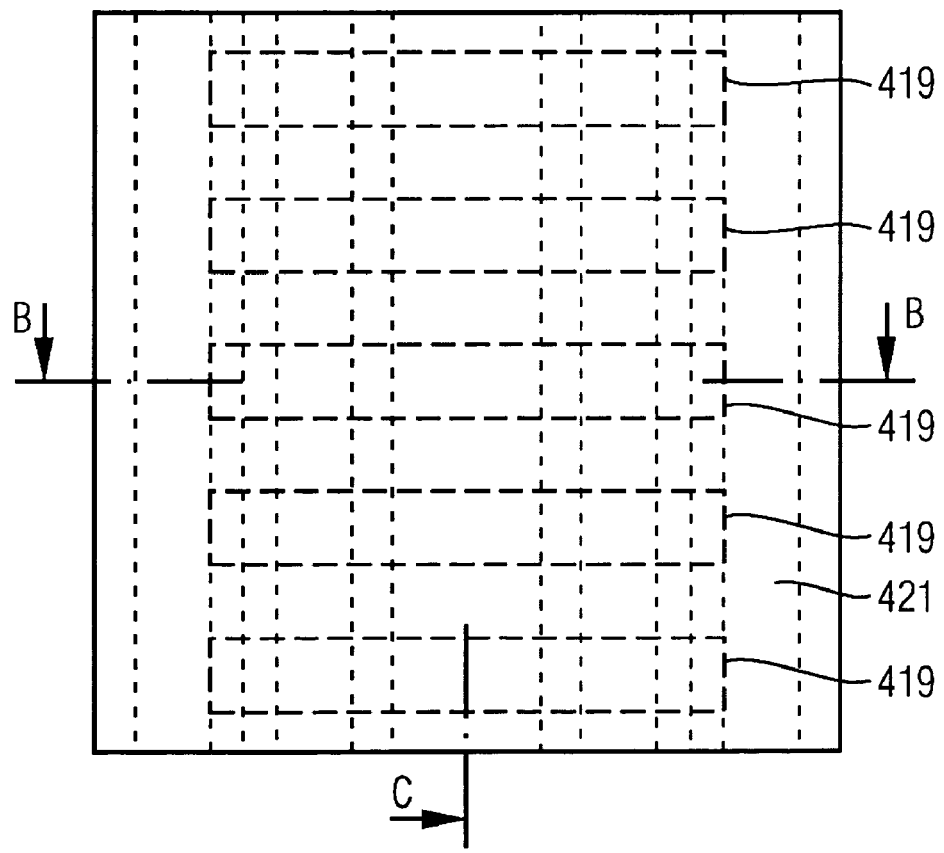
FIGS. 6A-6C show a plan view and two cross-sectional views of the section of a substrate for illustrating the patterning method according to the exemplary embodiment of FIGS. 1A-1C after filling the buried mask.
Figure 6B:
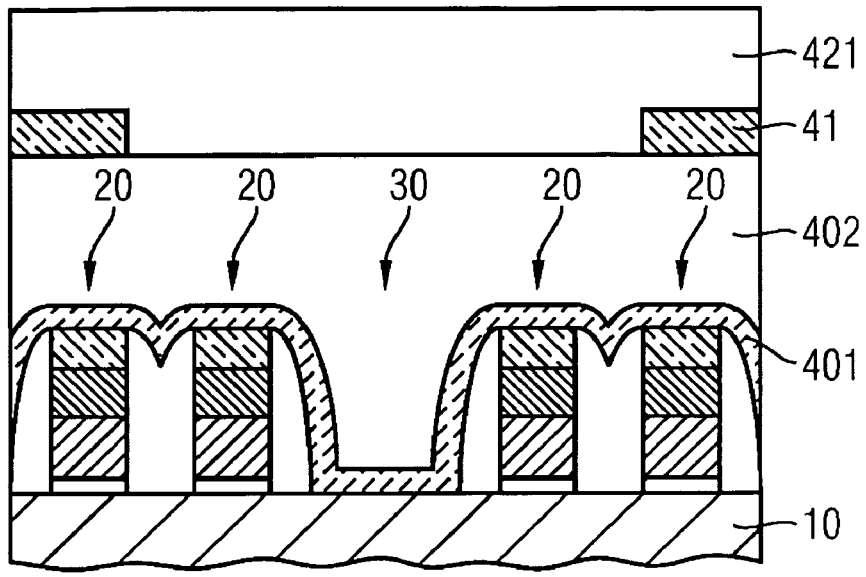
Figure 6C:
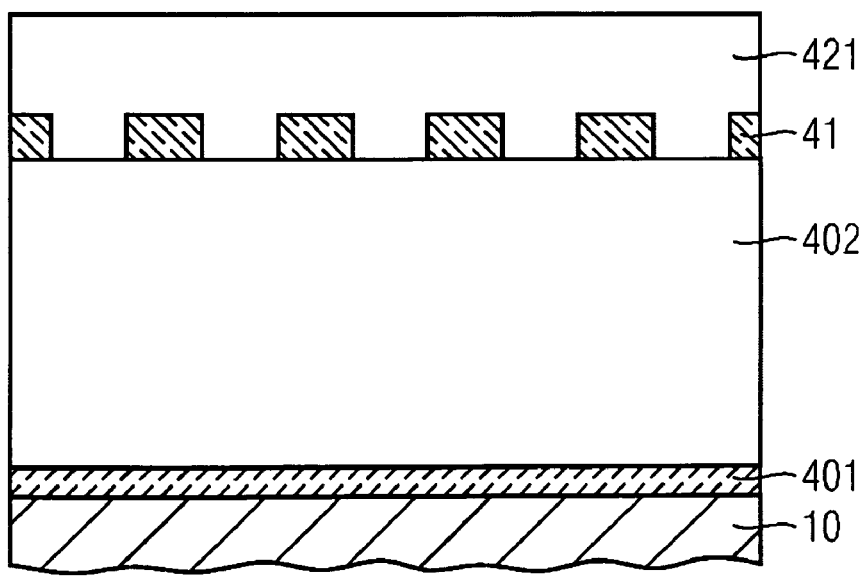

Referring to FIGS. 6A-6C, a fill material 421 is deposited to fill at least the template openings 419. The fill material 421 is selected to be selectively removable against the buried hard mask 41. The fill material 421 may also be selected to have similar etch properties as the interlayer 402. In an exemplary embodiment, the fill material 421 is a silicon oxide. According to a further exemplary embodiment, the fill material 421 is a silicon dioxide resulting from the decomposition of tetra ethyl ortho silicate. A silicon dioxide resulting from the decomposition of tetra ethyl ortho silicate fills a topology having grooves of a width from 10 to 50 nanometer, a length of 70 to 350 nanometer and a depth 30 to 60 nanometer in sufficient conformity and provides in case of an overfill a smooth top surface facing the buried hard mask 41.

FIG. 6B shows the fill material 421 overfilling the buried hard mask 41. The fill material 421 fills the template openings 419, covers the buried hard mask 41, and provides a smooth, plane surface without additional chemical mechanical polishing step.

Figure 7A:
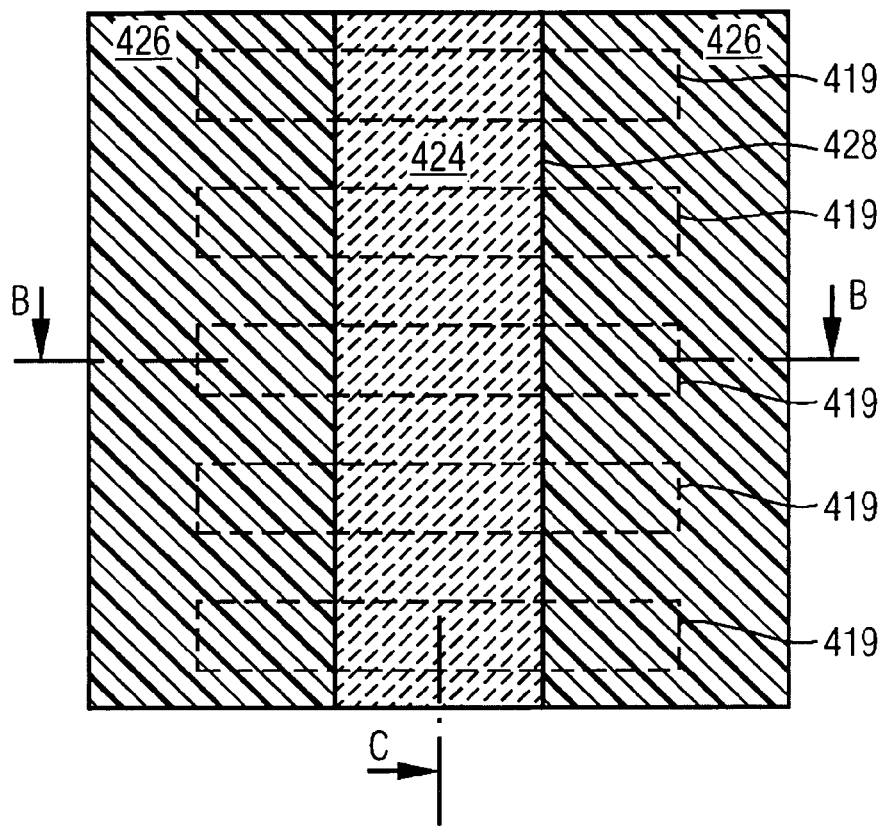
FIGS. 7A-7C show a plan view and two cross-sectional views of the section of a substrate for illustrating the patterning method according to the exemplary embodiment of FIGS. 1A-1C after providing a second resist mask.
Figure 7B:
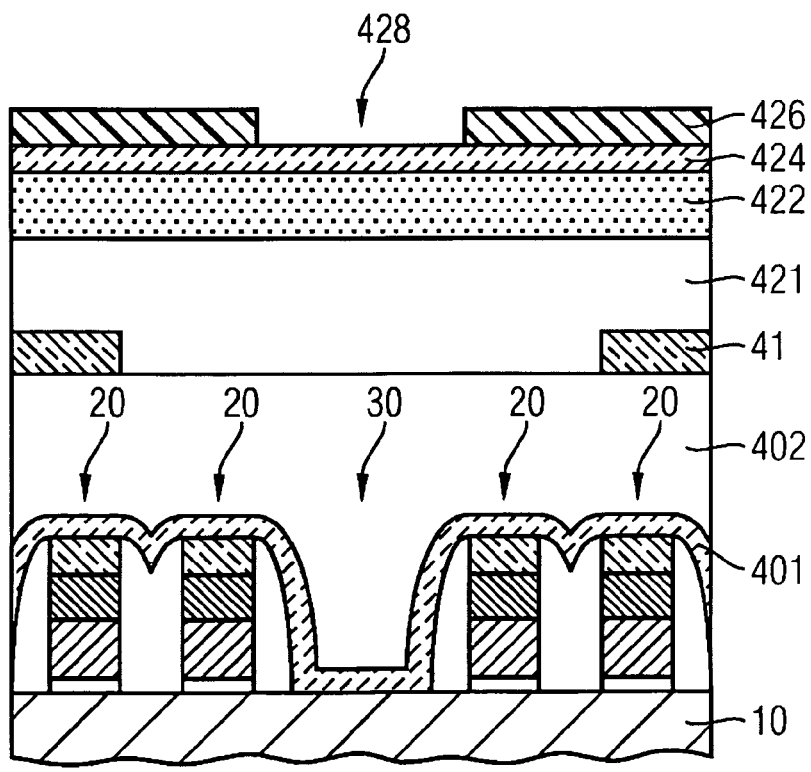
Figure 7C:
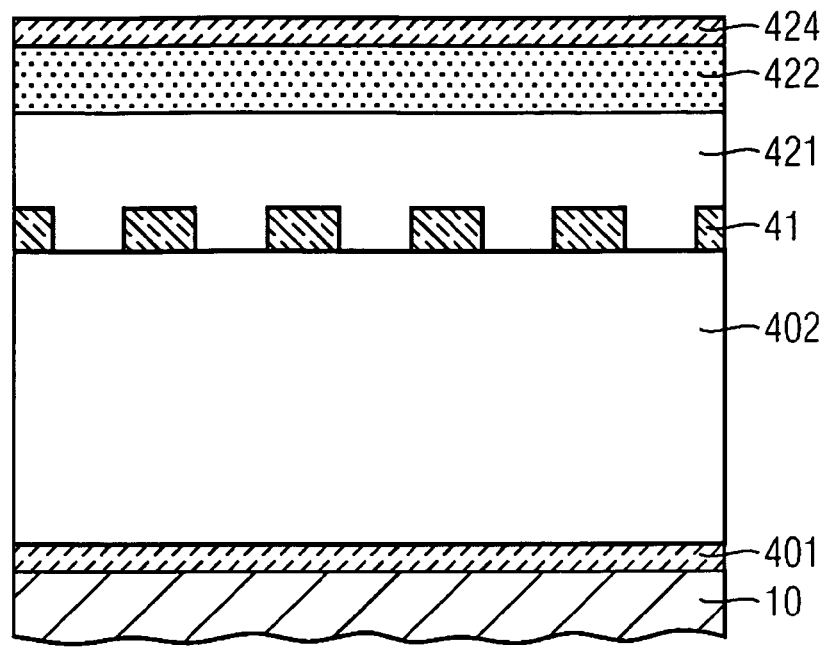

FIGS. 7A-7C refer to the formation of a top mask. A top mask layer 422 is deposited on the smooth, plane top surface of fill material 421. According to an exemplary embodiment, the top mask layer 422 is an amorphous carbon layer. According to an exemplary embodiment, the amorphous carbon layer is a conformal amorphous carbon layer having a thickness of 40 to 50 nanometers. The amorphous carbon layer may be deposited via a Plasma-Enhanced Chemical Vapor Deposition (PECVD) process, wherein acetylene $C_2H_2$, ethylene $C_2H_4$, propane $C_2H_6$ or another suitable carbon-hydroxide compound is supplied at a temperature of 250 to 550 degree Celsius. In one embodiment, propane $C_2H_6$ is supplied at a temperature of about 400 degree Celsius. The substantially constant supply rate may range from 500 to 3000 sccm. In one embodiment, the supply rate is about 2000 sccm. Further, an inert gaseous fluid, for example He, Ar, $N_2$ may be supplied at a substantially constant rate of 500 to 5000 sccm. In an exemplary embodiment, He is supplied at a rate of 700 sccm. The substantially constant ambient pressure may range from 3 to 8 Torr and the substantially constant power of the plasma may range from 800 to 2000 W. In one embodiment, the ambient pressure is about 5 Torr and the plasma power is about 1600 W. An upper sacrificial mask layer 424 may be deposited on the top mask layer 422. The upper sacrificial mask layer 424 may have a thickness of about 20 to 60 nanometer. A second resist mask 426 may be provided on the upper sacrificial mask layer 424.

According to FIG. 7B, the second resist mask 426 has a resist opening 428 that extends along the pitch axis and has a width along the line axis that is significantly smaller than the length of the template openings 419. In this embodiment, the width of the resist opening 428 is about half the length of the template opening 419. The resist opening 428 exposes a section of the upper sacrificial mask layer 424 above the spaces 30.

Figure 8A:
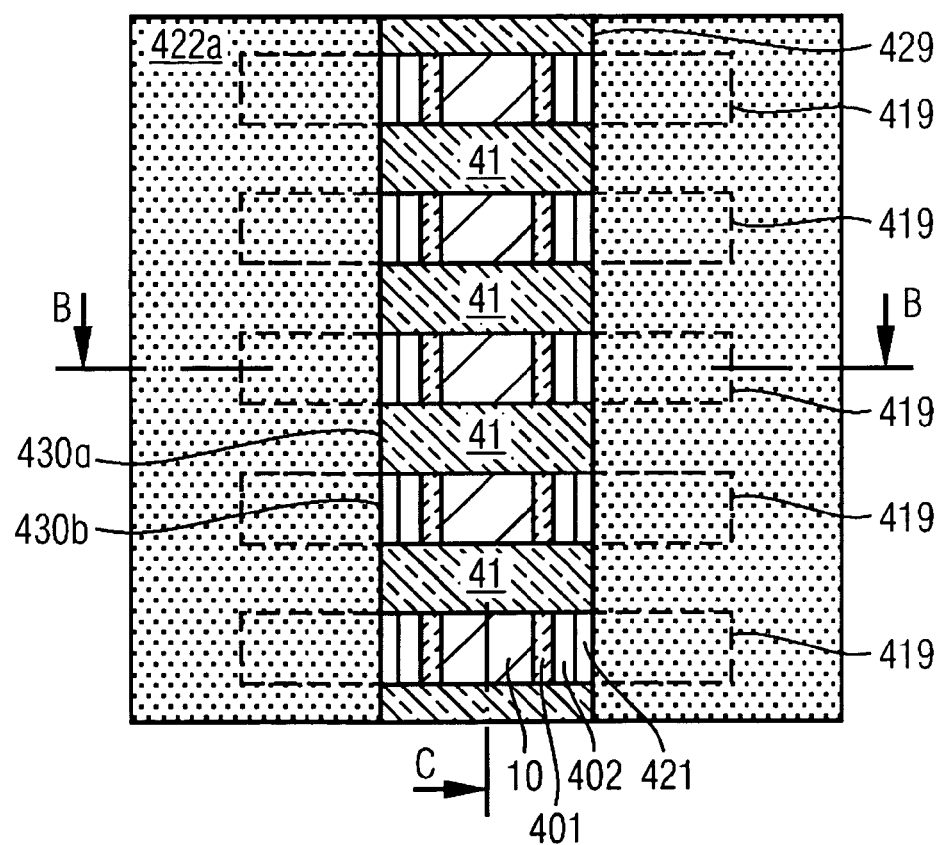
FIGS. 8A-8C show a plan view and two cross-sectional views of the section of a substrate for illustrating the patterning method according to the exemplary embodiment of FIGS. 1A-1C after etching the fill material and the interlayer.
Figure 8B:
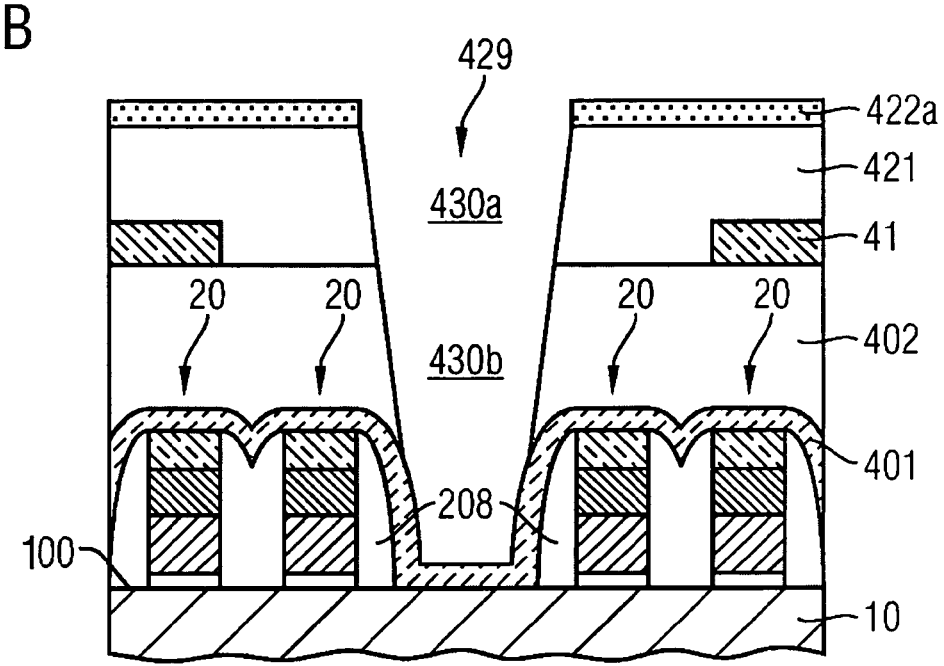
Figure 8C:
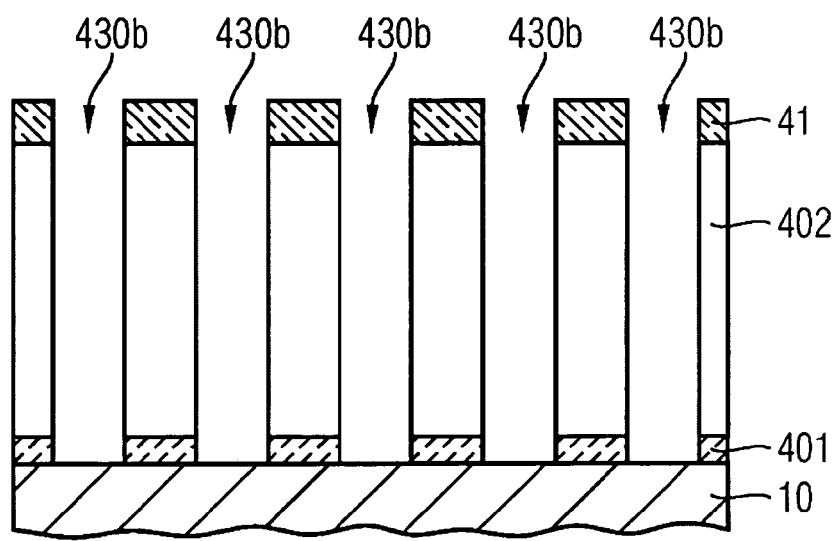
Figure 9A:
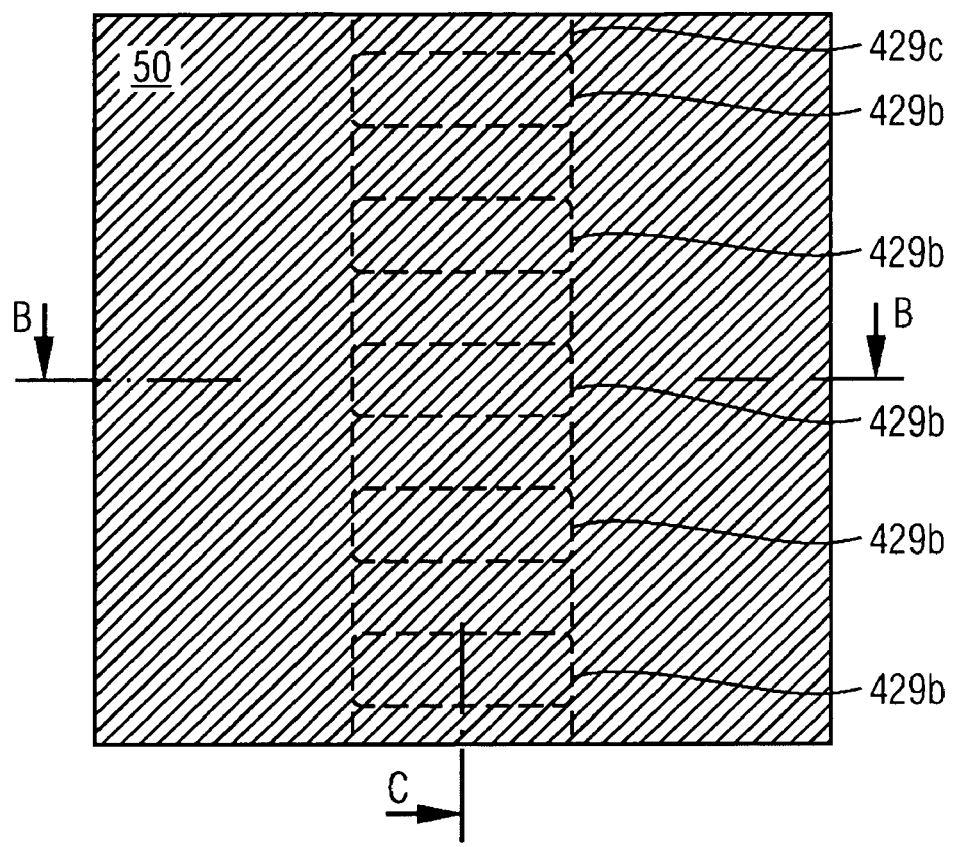
FIGS. 9A-9C show a plan view and two cross-sectional views of a section of a substrate for illustrating a method of manufacturing a contact arrangement according to a further exemplary embodiment of the device after providing a contact material.
Figure 9B:
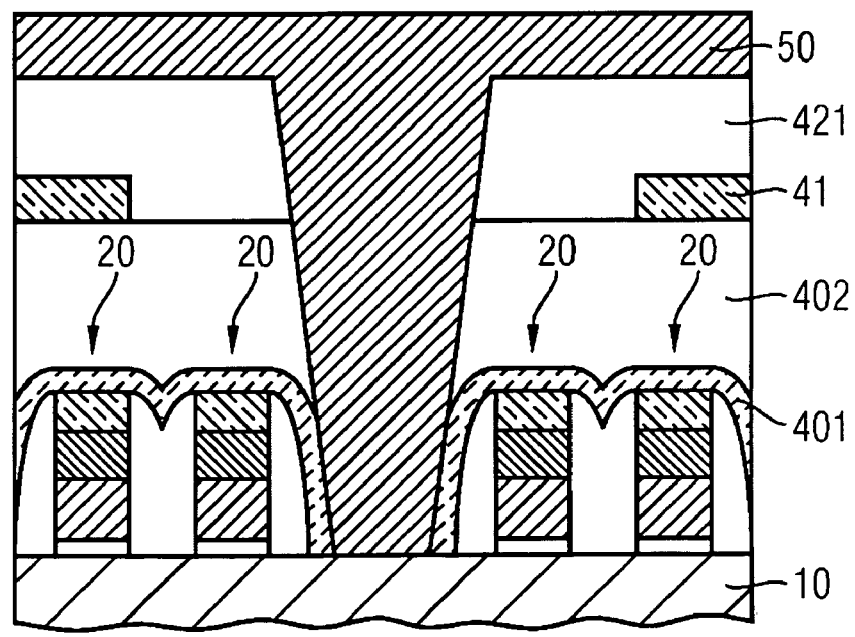
Figure 9C:
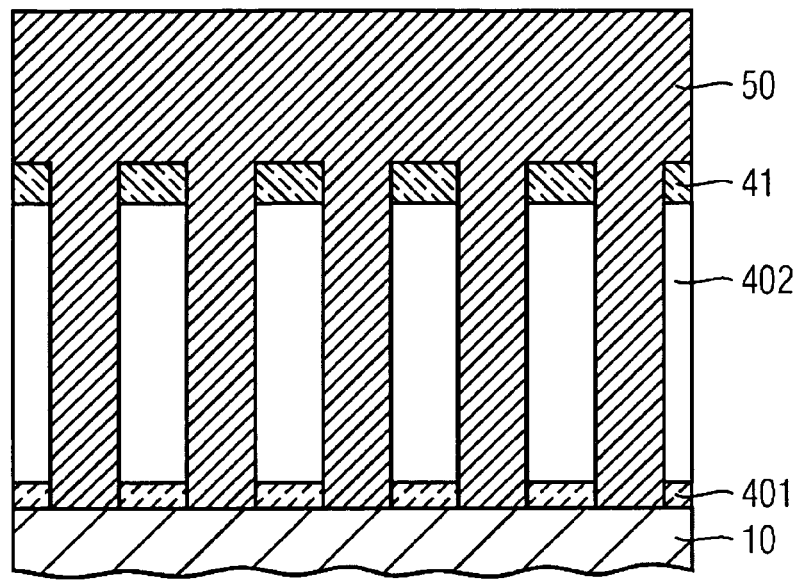

Referring to FIGS. 8A-8C, sections of the upper sacrificial mask layer 424 that are exposed by the resist openings 428 are removed, thereby exposing a section of the top mask layer 422. The exposed section of the top mask layer 422 is selectively removed to form a trim opening 429 in the top mask layer 422 to form a top mask 422a from the top mask layer 422.

The fill material 421 and the interlayer 402 are etched using the top mask 422a and the buried hard mask 41 as combined hard mask. Etching of the fill material 421 and interlayer 402 may be performed in a single etch being effective on both materials or in a sequence of two etch steps, wherein a first etch step is effective on the fill material 421 and the second etch step is effective on the interlayer 402. The etching stops at the upper edge of etch stop liner 401, wherein between the wide spaced gate lines 20 the etching is routed by vertical sections of the etch stop liner 401 covering the sidewall spacers 208. The exposed sections of etch stop liner 401 covering the substrate surface 100 may be removed by an anisotropic etch process.

FIGS. 8A-8C show an etch groove 430 with bottom sections 430b and a top section 430a. The top section 430a corresponds to the trim opening 429. The cross section of the bottom portions 430b results in each case from the overlap of the trim opening 429 with the template openings 419. Each section of the etch groove 430 is tapered with a wider end towards the upper edge and a narrow end towards the substrate surface 100.

FIG. 8A shows the top portion 430a of the etch groove 430 that exposes sections of the buried hard mask 41 between neighboring template openings 419 and the bottom portions 430b of the etch groove 430 that expose on their sidewalls interlayer 402 and etch stop liner 401 and at the bottom the semiconductor substrate 10. A residual portion of the top mask 422a with trim opening 429 bears on the fill material 421.

The FIGS. 9A-9C and 10A-10C refer to process steps that complete a method of manufacturing a contact arrangement on base of the patterning method described via the FIGS. 1A-1C to 7A-7C. According to FIGS. 9A-9C, a contact material 50 is deposited that fills the etch groove 430. The contact material 50 may be heavily doped polycrystalline silicon, tungsten or any other high conductive material. The formation of adhesive and barrier liners on the sidewalls and/or in the bottom portion of the etch groove 430 may precede the deposition of the contact material 50.

According to an exemplary embodiment, FIGS. 1A-1C to 9A-9C may refer to a method of manufacturing an interconnect structure in a dual damascene technique, wherein the contact material 50 filling the bottom portions 430b forms contacts and the contact material 50 filling the upper portion 430a forms a connection line. The dotted lines in FIG. 9A may correspond to a plurality of contacts 429b and to a connection line 429c bearing on the contacts 429b.

Figure 10A:
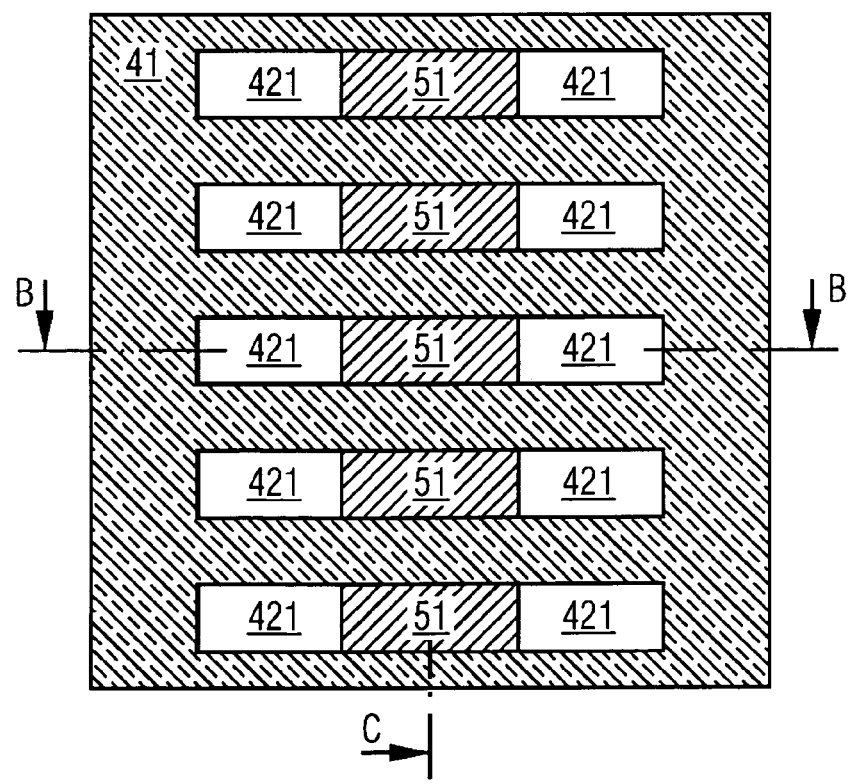
FIGS. 10A-10C show a plan view and two cross-sectional views of the section of a substrate for illustrating the method of manufacturing a contact arrangement according to the further exemplary embodiment of FIGS. 9A-9C after recessing the contact material.
Figure 10B:
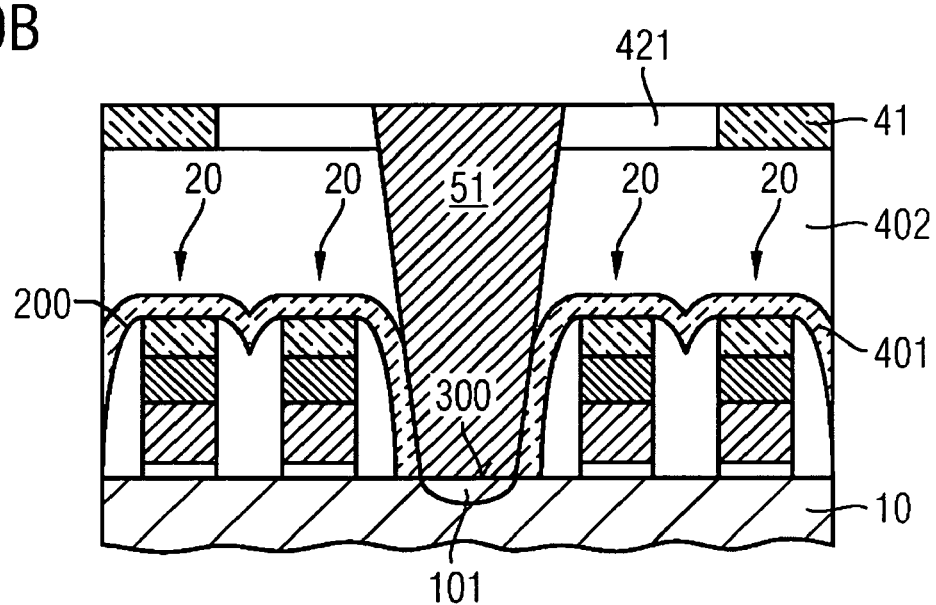
Figure 10C:
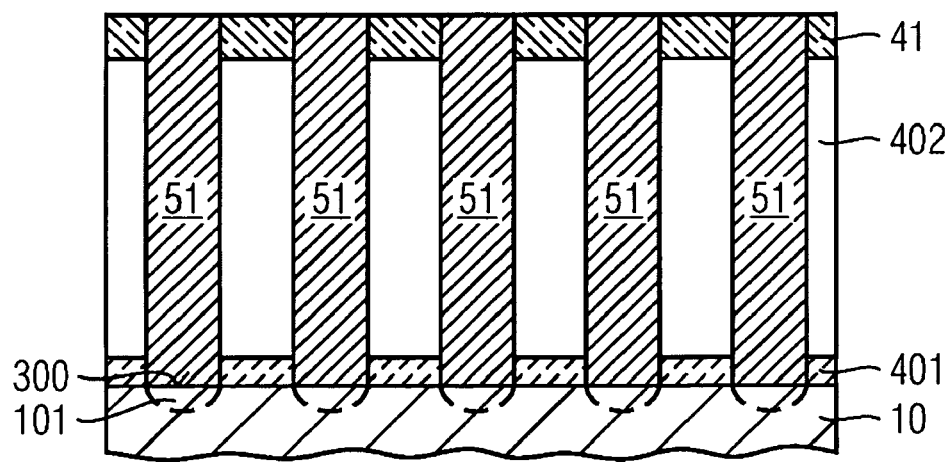

Referring to FIGS. 10A-10C, the contact material 50 is recessed in a chemical mechanical polishing step to the upper edge of the buried hard mask 41 to form individual contact structures 51. The portions of the contact material 50 filling the top section 430a of the etch groove 430 are removed.

As shown in FIG. 10A, the width of the contact structures 51 along the line axis results from the width of the trim opening 429, whereas the width of the contact structures 51 along the pitch axis results from the width of the template openings 419. Each contact structure 51 is electrically connected to one of the contact areas 300 on the substrate surface 100. The contact structures 51 have sublithographic dimensions along both axes. The formation of the contact structures 51 does not require specific lithographic tools and is comparable simple and stable. A dense contact arrangement with short, sublithographic contact structures 51 arranged at narrow pitch along the pitch axis may be achieved.

The contact arrangement as illustrated in FIGS. 10A-10C comprises a substrate including a semiconductor substrate 10 and gate lines 20 and has a pattern surface 200 with a plurality of contact areas 300 forming sections of the pattern surface 200. The contact areas 300 are arranged in a contact row along the pitch axis. The contact row is confined by two gate lines 20 that are arranged on a substrate surface 100 of semiconductor substrate 10 and extend along the pitch axis on both sides of the contact row. The gate lines 20 are separated by a space that extends over the contact areas 300. An interlayer 402 fills the space and covers the substrate comprising the semiconductor substrate 10 and the gate lines 20. A buried hard mask 41 bears on the interlayer 402 and has an upper edge and template openings 419. The template openings 419 have in each case a template width w1 along the pitch axis and a template length 1 along the line axis that is perpendicular to the pitch axis. The template openings 419 are arranged along the pitch axis in each case in a distance to each other that may be equal to or smaller than the template width w1. The template openings 419 are partially filled with a fill material 421. Contact structures 51 that in each case extend from the upper edge of buried hard mask 41 to one of the contact areas 300 pass through a section of one of the template openings 419 respectively. The buried hard mask 41 may be a silicon nitride mask. According to an exemplary embodiment, the fill material 421 and the material forming the interlayer 402 are made of a silicon oxide. An etch stop liner 401 of silicon oxinitride may cover the gate lines 20 while exposing the contact areas 300. The exposed sections, of the pattern surface 200, form process sections with a target length and a target width that are decoupled from mutual lithographic requirements.

Figure 11A:
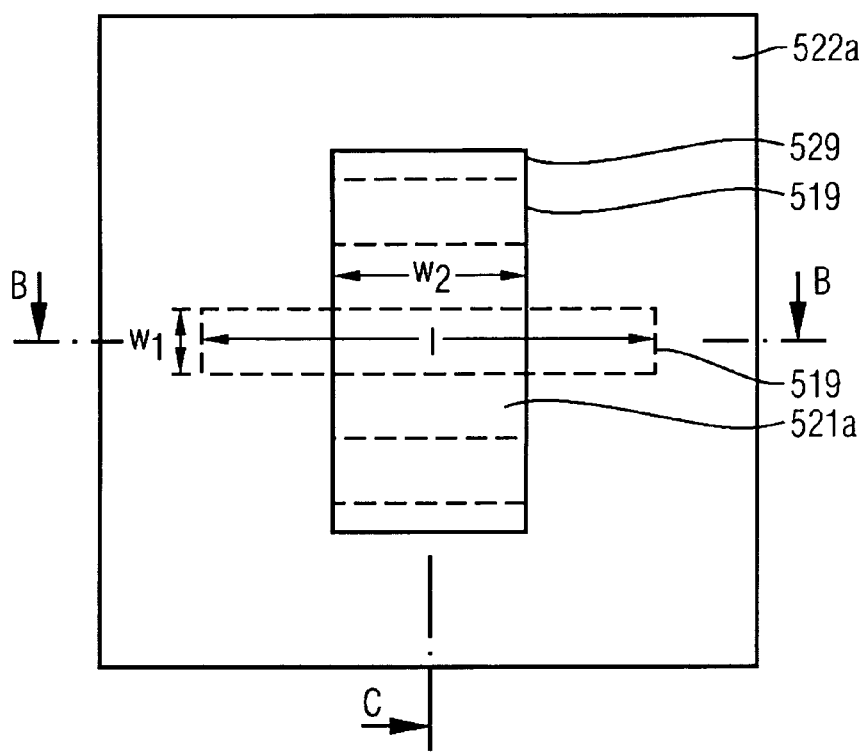
Figure 11B:
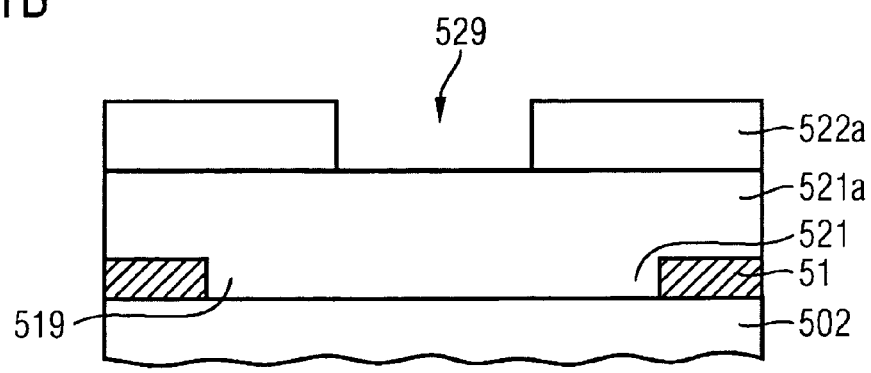

FIGS. 11A-11C illustrate a hard mask arrangement. An interlayer 502 covers a substrate surface 501 of a substrate 500. A buried hard mask 51 is provided on the interlayer 502. The buried hard mask 51 has a template opening 519. The template opening 519 has a template length 1 along a line axis and a template width w1 along a pitch axis running perpendicular to the line axis. The template width w1 may correspond to the minimal lithographic line width achieved by lithographic resolution enhancement techniques. The length 1 of the template opening 519 may be five to seven times the template width w1. A fill material 521 fills the template opening 519. According to this exemplary embodiment, the fill material 521 does not only fill the template opening 519, but forms also a space layer 521a covering the buried hard mask 51. A top mask 522a bears on a planar, smooth top surface of space layer 521a. The top mask 522a may be an amorphous carbon mask. The top mask 522a has a trim opening 529, the vertical projection of which crosses the template opening 519. A trim width w of the trim opening 529 along the line axis is smaller than the template length 1.

The interlayer 502 may be a doped silicate glass, e.g., boron-phosphorus doped silicate glass (BPSG). The fill material 521 may be a silicon dioxide resulting from the decomposition of tetra ethyl ortho silicate. The interlayer 502 may have a thickness of 150 to 450 nanometers. The buried hard mask 51 may have a substantially conformal thickness of about 30 to 80 nanometer. The fill material 521 may have a substantially conformal thickness of 100 to 300 nanometers and the amorphous carbon layer a substantially uniform thickness of 250 to 350 nanometers.

While the methods and devices have been described in detail with reference to specific embodiments thereof, it will be apparent to one of ordinary skill in the art that various changes and modifications can be made therein without departing from the spirit and scope thereof. Accordingly, it is intended that the present methods and devices cover the modifications and variations of this method and device provided they come within the scope of the appended claims and their equivalents.

LIST OF REFERENCE SIGNS 10 semiconductor substrate
100 substrate surface
101 impurity region
20 gate line
200 pattern surface
201 gate dielectric
202 gate conductor layer
204 high conductivity layer
206 cap layer
208 sidewall spacer
30 space
300 contact area
401 etch stop liner
402 interlayer
41 buried hard mask
410 buried mask layer
412 first sacrificial mask layer
414 second sacrificial mask layer
416 first resist mask
418 resist opening
419 template opening
421 fill material
422 top mask layer
422a top mask
424 upper sacrificial mask layer
426 second resist mask
428 resist opening
429 trim opening
429b contact
429c connection line
430 etch groove
430a top section
430b bottom section
50 contact material
51 contact structure
1 template length
w1 template width
w2 trim width
500 substrate
501 substrate surface
502 interlayer
51 buried hard mask
519 template opening
521 fill material
521a spacer layer
522a top mask
529 trim opening

What is claimed is:
1. A method of patterning a substrate, comprising:
(a) providing a substrate including a pattern surface;
(b) disposing an interlayer on the pattern surface;
(c) providing a buried hard mask on the interlayer, the buried hard mask including a template opening with a template length disposed along a line axis and a template width perpendicular thereto;
(d) filling the buried hard mask with a fill material;
(e) providing a top mask of amorphous carbon via a plasma-enhanced chemical vapor deposition based amorphous carbon layer above the filled buried hard mask, the top mask including a trim opening crossing the template opening and having a trim width disposed along the line axis and is smaller than the template length; and
(f) etching the fill material and the interlayer via the top mask and the buried hard mask such that a process section of the pattern surface is exposed and such that a target length and width of the process section result from the template and trim widths;
wherein providing the top mask comprises:
disposing an amorphous carbon layer above the buried hard mask;
disposing an upper sacrificial mask layer on the amorphous carbon layer;
providing a second resist mask on the upper sacrificial mask layer, wherein the second resist mask comprises a resist opening that exposes a section of the upper sacrificial mask layer;
removing the exposed section of the upper sacrificial mask layer, thereby exposing a section of the amorphous carbon layer; and
removing the exposed section of the amorphous carbon layer, thereby providing the trim opening and the top mask via the amorphous carbon layer.

2. The method of claim 1, wherein (d) includes disposing the fill material in the template opening and on the buried hard mask.

3. The method of claim 2, wherein the fill material is a silicon dioxide from the decomposition of tetra ethyl ortho silicate.

4. A method of patterning a substrate, comprising:
(a) providing a substrate including a pattern surface;
(b) disposing an interlayer on the pattern surface;
(c) providing a buried hard mask on the interlayer, the buried hard mask including a template opening with a template length disposed along a line axis and a template width perpendicular thereto;
(d) filling the buried hard mask with a fill material;
(e) providing a top mask of amorphous carbon above the filled buried hard mask, the top mask including a trim opening crossing the template opening and having a trim width disposed along the line axis and is smaller than the template length; and
(f) etching the fill material and the interlayer via the top mask and the buried hard mask such that a process section of the pattern surface is exposed and such that a target length and width of the process section result from the template and trim widths,
wherein providing a buried hard mask comprises:
disposing a buried mask layer on the interlayer;
disposing a first sacrificial mask layer formed of a second amorphous carbon layer on the buried mask layer;
patterning the second amorphous carbon layer thereby exposing a section of the buried mask layer; and
removing the exposed section of the buried mask layer thereby forming the buried hard mask via the buried mask layer, the buried hard mask comprising the template opening corresponding to the exposed section,
wherein patterning the second amorphous carbon layer comprises:

providing a second sacrificial mask layer on the second amorphous carbon layer;

providing a first resist mask on the second sacrificial mask layer, the first resist mask including a resist opening that exposes a section of the second sacrificial mask layer;

removing the exposed section of the second sacrificial mask layer thereby exposing a section of the second amorphous carbon layer; and removing the exposed section of the second amorphous carbon layer.

5. The method of claim 4, wherein the buried mask layer is a silicon nitride layer.

* * * * *